(12) United States Patent
Aipperspach et al.

(10) Patent No.: US 7,009,905 B2
(45) Date of Patent: Mar. 7, 2006

(54) METHOD AND APPARATUS TO REDUCE BIAS TEMPERATURE INSTABILITY (BTI) EFFECTS

(75) Inventors: Anthony Gus Aipperspach, Rochester, MN (US); William Paul Hovis, Rochester, MN (US); Terrance Wayne Kueper, Rochester, MN (US); John Edward Sheets, II, Zumbrota, MN (US)

(73) Assignee: International Business Machines Corporation, Armond, NY (US)

( * ) Notice: Subject to any disclaimer, the term of this patent is extended or adjusted under 35 U.S.C. 154(b) by 218 days.

(21) Appl. No.: 10/744,175

(22) Filed: Dec. 23, 2003

(65) Prior Publication Data

US 2005/0134360 A1    Jun. 23, 2005

(51) Int. Cl.
*G11C 7/04* (2006.01)

(52) U.S. Cl. ...................................... 365/211; 365/190

(58) Field of Classification Search ................ 365/211, 365/190
See application file for complete search history.

(56) References Cited

U.S. PATENT DOCUMENTS

| | | | |
|---|---|---|---|
| 5,295,079 A * | 3/1994 | Wong et al. ................. | 714/715 |
| 6,400,629 B1 | 6/2002 | Barth, Jr. et al. | |
| 6,760,398 B1 * | 7/2004 | Casagrande ................... | 377/47 |
| 6,778,451 B1 * | 8/2004 | Takahashi et al. .......... | 365/201 |
| 2003/0198110 A1 | 10/2003 | Hasegawa et al. | |

* cited by examiner

*Primary Examiner*—Michael Tran
(74) *Attorney, Agent, or Firm*—Robert R. Williams (57) ABSTRACT

Methods and apparatus are disclosed that allow an electronic system implemented with field effect transistors (FETs) to reduce threshold voltage shifts caused by bias temperature instability (BTI). BTI caused VT shifts accumulate when an FET is in a particular voltage stress condition. Many storage elements in an electronic system store the same data for virtually the life of the system, resulting in significant BTI caused VT shifts in FETs in the storage elements. An embodiment of the invention ensures that a particular storage element is in a first state for a first portion of time the electronic system operates, during which data is stored in a storage element in a first phase, and that the particular storage element is in a second state for a second portion of time the electronic system operates, during which data is stored in the storage element in a second phase.

42 Claims, 9 Drawing Sheets

Fig. 7

METHOD AND APPARATUS TO REDUCE BIAS TEMPERATURE INSTABILITY (BTI) EFFECTS

BACKGROUND OF THE INVENTION

1. Field of the Invention

The present invention generally relates to field effect transistor circuits. More specifically, the present invention relates to field effect transistors subject to bias temperature instability caused threshold voltage shifts.

2. Description of the Related Art

Modern electronic systems, for examples, computer processors, personal digital assistants (PDAs), digital cameras, currently rely on logic and storage circuits utilizing field effect transistors (FETs) fabricated on semiconductor chips. Complementary Metal Oxide Semiconductor (CMOS) circuits are widely used in such logic and storage circuitry because of the speed and relatively low power offered by CMOS circuits. CMOS circuits utilize P-channel field effect transistors (PFETs) and N-channel field effect transistors (NFETs).

Recent advances in technology have reduced the physical sizes of the FETs. Voltage supplies have been reduced to save power as well as to accommodate requirements of the reduction in the physical sizes of the FETs. FET threshold voltages (VTs) have been reduced to mitigate the performance degradation effects of reduced FET gate voltages resultant from reduction of supply voltages. As a result of the shrinking sizes of the FETs and the reduction in VTs, Negative Bias Temperature Instability (NBTI) caused VT shifts in PFETs are becoming a significant problem that results in performance degradation, voltage sensitivity, and causing what might have been marginal but operative memory storage locations to become failing storage locations. The NBTI caused VT shift causes an increase (absolute value) of VT, in a PFET, that is a function of the gate voltage relative to the source and drain voltages on the PFET. NBTI caused VT shift accumulates over time during which the PFET is in a voltage condition that stresses NBTI caused VT shift. NBTI caused VT shift in PFETs is a significant problem in today's technology. NBTI caused VT shift in PFETs is herein discussed in detail. A similar VT shift in NFETs exists, although to a lesser degree than in PFETs in current technology. Such VT shift in an NFET is called PBTI (Positive Bias Temperature Instability). The examples described hereinafter illustrate how embodiments of the present invention overcomes many of the adverse effects of NBTI caused VT shifts in PFETs; however, similar embodiments are contemplated to reduce PBTI caused VT shifts in NFETs.

A PFET is in an NBTI voltage stress condition when the source and the drain of the PFET are both at a "high" voltage level and the gate is at a "low" voltage level. For example, in a current CMOS chip having a 1-volt supply voltage, a PFET is in an NBTI voltage stress condition when its source and its drain are at 1-volt and its gate is at ground (0-volts). When the gate is "high" and the source is "high", the PFET tends to recover somewhat from NBTI caused VT degradation. Ideally, a balanced duty cycle for PFETs (50% in an NBTI voltage stress condition, 50% not in an NBTI voltage stress condition) would produce the most uniform stress. An NFET is in a PBTI voltage stress condition when a gate on the NFET is "high" and a source and a drain of the NFET are at a "low" voltage.

Although NBTI caused VT shift is known within the industry, most methods for attempting to address the degradation problem associated with the VT shift deal with process techniques to minimize the amount of NBTI caused VT shift that occurs. However, thinning gate oxides (or other dielectric material used for the gate dielectric) and decreasing supply voltages has made the NBTI caused VT shifts that occur more significant as an overall percentage of the normal VT variability. A typical NBTI caused VT shift is 30 to 40 mV (millivolts) for a 50% duty cycle (that is, the PFET spends half of the time in an NBTI voltage stress condition, half of its time not in an NBTI voltage stress condition) of the PFET, however the NBTI caused VT shift may be 80 to 90 mV if the duty cycle is close to 100% (i.e., the PFET is almost always in an NBTI voltage stress condition). If an almost 0% duty cycle exists (i.e., the PFET is almost never in an NBTI voltage stress condition), virtually no NBTI caused VT shift occurs. Years ago, supply voltage was typically 5-volts and VT was approximately 700 mV. Currently, supply voltage is approximately 1-volt and VT is approximately 200 mV, and an NBTI caused VT shift of 80 to 90 mV is a significant percentage of the total VT of modern PFETs.

A number of use situations can cause the duty cycle of a particular PFET to be significantly other than 50%. For example, in a memory array (e.g., a static random access memory (SRAM), or dynamic random access memory (DRAM)), ABIST (array built in self test) is commonly applied during testing of the chip. ABIST is further used during burn-in stress conditions (elevated temperature and/or supply voltage) which are required to identify defects in the chip. The increased temperature and supply voltage conditions applied during burn-in increases the rate of degradation due to NBTI caused VT shifts. During burn-in, ABIST produces patterns that are coupled to the memory array. ABIST checks resultant output patterns against results expected from a memory array having no defect. The intent of these patterns is to stress the memory array, looking for all possible defect types with various disturb patterns. These patterns are needed but do not guarantee a 50% duty cycle on each bit line, word line, or storage element in the array. In fact, many sets of ABIST patterns result in a duty cycle near 100% for at least some PFETs in the memory array. Many electronic systems also run ABIST during restarts of the electronic systems. Restarts occur when the electronic system is powered up. Restarts on many electronic systems can be caused by manual intervention.

During normal operation of the electronic system, some storage elements may be written into and seldom if ever change, causing some of the PFETs to remain almost constantly in a voltage condition that causes NBTI VT shifts to accumulate. For example, operating system code is copied from nonvolatile storage such as a disk into an on-chip storage element, such as a memory array, in an electronic system such as a computer, and is normally never changed for the entire time the computer is operating. Furthermore, it is likely that the operating system code is stored into the same locations in the storage element each time the computer is restarted.

Therefore, a need exists to provide method and apparatus that minimize the NBTI caused VT shift of storage elements on semiconductor chips.

SUMMARY OF THE INVENTION

The present invention generally provides methods and apparatus that reduce NBTI caused VT shift in FETs, particularly PFETs in current technology, by making a duty cycle closer to 50% in those FETs. Duty cycle is the fraction of time an FET is in a voltage condition that causes NBTI caused VT shift to occur.

In a method embodiment, a controller controls a phase of an input data signal written into a storage element, and also controls a phase of a storage element data selected from the storage element. During a first time period, a first phase of the input data signal is stored in the storage element as storage element data and a first phase of the storage element data stored in the storage element is selected for output. Respondent to activation of a phase mode switch trigger, a second time period begins. During the second time period, a second phase of the input data signal is stored in the storage element. When the second phase of the input data signal is stored in the storage element, a second phase of the storage element data is selected for output.

In an apparatus embodiment, a controller produces a clock output and a phase mode output. The apparatus has a storage element, such as a latch, a register, an SRAM, or a DRAM, for examples capable of storing data. The storage element stores input data from an input data signal as storage, the phase of the input data signal being selected by an input phase select under control of the phase mode. The selected phase of the input data signal is clocked into the storage element as storage element data. An output phase select outputs a first phase or a second phase of the storage element data, selected under control of the phase mode. A phase mode switch trigger in, or coupled to, the controller, switches the phase mode from a first phase mode value to a second phase mode value upon occurrence of a predetermined event. By periodically changing the value of the phase mode, an improved duty factor of NBTI voltage stress conditions is obtained in the storage element.

In an embodiment, the storage element is a memory array and the controller is an array built in self test (ABIST) controller. The input data signal is coupled to the ABIST controller; the ABIST controller provides an address input to the storage element, and the output of the output phase select is coupled to the ABIST controller. The ABIST controller changes the value of the phase mode at the beginning (or, alternatively, the end) of a set of ABIST patterns.

In an embodiment, the phase mode switch trigger wants to change the value of the phase mode, but the proper phase of the storage element data is required by logic in the electronic system apparatus. The controller changes the phase of the storage element data prior to changing the value of the phase mode.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Having reference now to the figures, and having provided above a discussion of the art, the present invention will be described in detail.

The present invention generally provides methods and apparatus to reduce bias temperature instability (BTI) caused VT shift in FET circuits by making a duty cycle of many circuits, particularly storage elements, closer to being in a first voltage bias condition a first portion of the time an electronic system is used, and in a second voltage bias condition a second portion of the time the electronic system is used. The first voltage bias condition being an BTI voltage stress condition, the second voltage bias condition not being an BTI voltage stress condition. P-Channel FETS (PFETs) are particularly subject to negative bias temperature instability (NBTI) caused VT shifts in today's technology, however the present invention also contemplates positive bias temperature instability (PBTI) caused VT shifts in N-Channel FETs (NFETs). Because NBTI caused VT shift is a problem with PFETs in present technologies more so than PBTI caused VT shift is a problem with NFETs in present technologies, discussion and examples will focus on NBTI effects in PFETs, however, PBTI caused VT shifts in NFETs is contemplated. Such NBTI (PFETs) and PBTI (NFETs) will together be designated BTI (bias temperature instability). A PFET is in an NBTI voltage stress condition when its gate is at a low voltage (e.g., zero volts, or ground), and its source and drain are at a high voltage (e.g., Vdd). When the PFET is in the second voltage bias condition where its gate is at a high voltage, no perceptible NBTI caused VT shift occurs, and in fact, the NBTI caused VT shift tends to recover.

Figure 1:
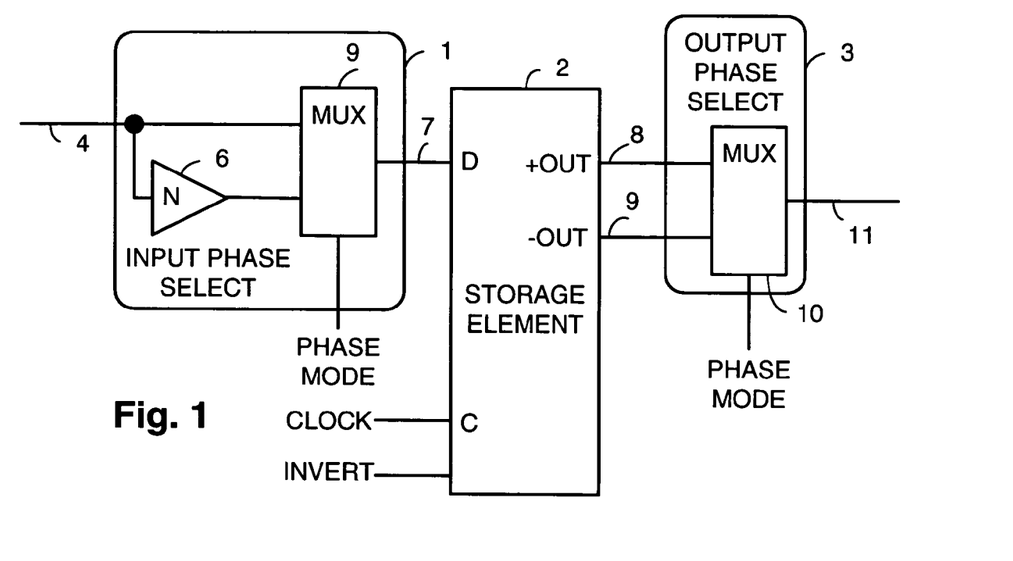
FIG. 1 is a block diagram of an input phase select, a storage element and an output phase select according to an embodiment of the present invention.

Referring now to FIG. 1, a storage element 2 is shown; receiving data input from an input phase select 1. An output phase select 3 is coupled between the output of the storage element and other logic (not shown) that requires storage element data. Storage element 2, in various embodiments is: a simple latch; a register having a plurality of latches; a static random access memory (SRAM); a dynamic random access memory (DRAM). Although, for simplicity, only a single data input is shown for storage element 2, (i.e., signal 7), any number of inputs is contemplated, as will be shown in subsequent figures and described later. It will be understood that when storage element 2 has multiple inputs, input phase select 1 also has multiple inputs, as does output phase select 3. For example, many registers used in modern computer systems have 32 or 64 data inputs. As a further example, SRAMs on a semiconductor chip typically have 32 or 64 data inputs, although SRAMs having more inputs or fewer inputs are also common. Storage element 2 is shown in exemplary FIG. 1 to have two outputs, outputs 8 and 9 for simplicity, outputs 8 and 9 being complementary signals representing one logical value. As with inputs to storage element 2, any number of outputs is contemplated. Although complementary outputs are shown, noncomplementary outputs are contemplated. Storage element 2 is shown in FIG. 1 as having a single clock input for simplicity, however some storage element embodiments such as SRAMs may require multiple clock inputs, and more than one clock input is contemplated. Storage element 2 is shown having an invert input that is used in some embodiments that are described later in more detail. Storage element data is inverted (toggled) within such embodiments of storage element 2 when a signal driving the invert input is activated. A J-K flip flop is an example of such a storage element, having an input consisting of a J signal and a K signal that, if both are "1" at a time of a clock edge, then storage element data in the J-K flip flop toggles.

Input phase select 1 has a multiplexer 9 that receives an input data signal 4 at a first input. Inverter 6 provides a signal complementary to input data signal 4 at a second input of multiplexer 9. A phase mode is coupled to multiplexer 9. Multiplexer 9 outputs input data signal 4 or the complement of input data signal 4, controlled by phase mode. If complementary data is available as input data signal 4, inverter 6 is not required.

Output phase select 3 has a multiplexer 10 that receives a true phase of the storage element data from storage element 2 on signal 8 and a complement phase of the storage element data from storage element 2 on signal 9. Multiplexer 10 outputs on signal 11 the true phase or the complement phase of the storage element data, controlled by phase mode. In some embodiments of the invention, signals 4 and 11 are physically the same electrical conductor using a bidirectional signaling protocol.

When phase mode has a value of "1", a "1" on input data signal 4 will be stored in storage element 2 as a "1", and will be output on signal 11 as a "1". However, when phase mode has a value of "0", the "1" on input data signal 4 will be stored in storage element 2 as a "0", and will be output on signal 11 as a "1". Similarly, when phase mode is "1", a "0" on input data signal 4 will be stored in storage element 2 as a "0" and will be output on signal 11 as a "0". When phase mode is "0", a "0" on input data signal 4 will be stored in storage element 2 as a "1" and will be output on signal 11 as a "0". Other logic in the electronic system (not shown) producing values on input data signal 4 and other logic (not shown) using values on signal 11 do not need to know which phase of data is stored in storage element 2, unless the value of phase mode changes while the storage element data is still required by the other logic, in which case, the storage element data has to be rewritten in opposite phase prior to use by the other logic, as will be described in more detail later.

Figure 2:
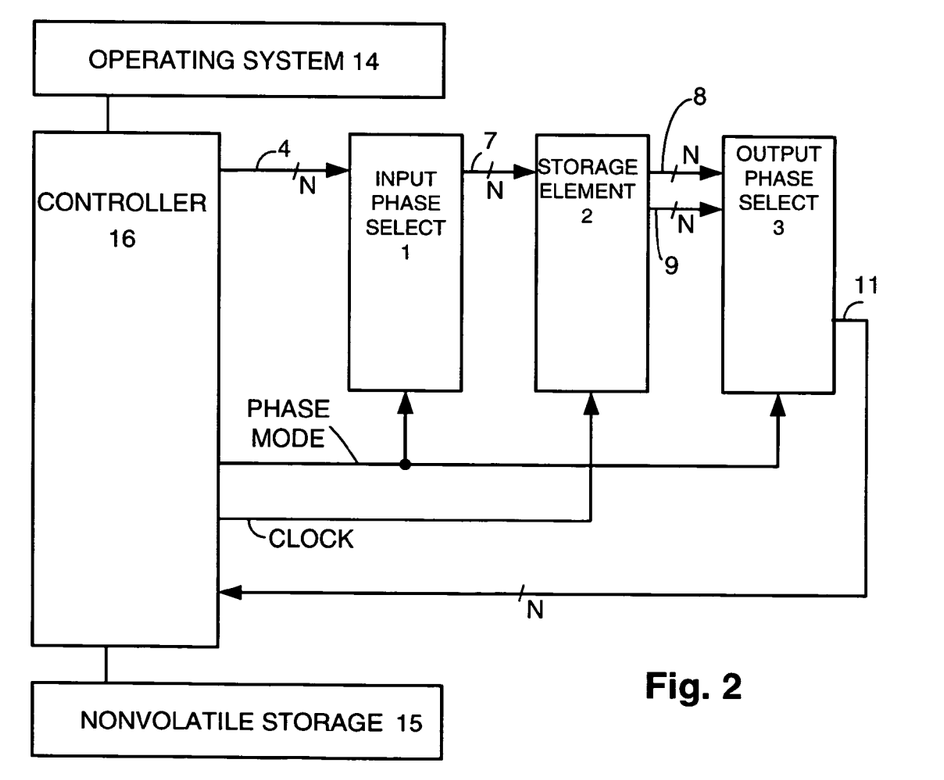
FIG. 2 is a block diagram of a controller coupled to a plurality of input phase selects and output phase selects, the input and output phase selects coupled to storage elements.

FIG. 2 shows an exemplary embodiment of the invention, input phase select 1 having receiving N inputs on signal 4. Storage element 2 in FIG. 2 is a register that stores N bits of data received from signal 4 with phase selected by input phase select 1 according to phase mode. Output phase select 3 selects a phase of storage data for each of the N bits stored in storage element 2, according to phase mode. FIG. 2 shows controller 16 coupled to input data signal 4. Controller 16 is further coupled to signal 11. Controller 16 provides phase mode and clock which function as taught in the discussion about FIG. 1. In various embodiments, controller 16 is a processor, such as an IBM iSeries processor; a microcontroller embedded on a semiconductor chip; an ABIST (array built in self test) controller which is capable of providing test patterns for a memory (e.g., SRAM or DRAM) and checking correct operation of the memory. Controller 16, for a first period of time drives a first value on phase mode, and, for a second period of time drives a second value on phase mode. Changing the value of phase mode at substantially equal intervals ensures that storage element 2, in the example of FIG. 2, will have a duty factor of substantially 50% if static (i.e., unchanging) data is written into the storage element. Even if the intervals differ substantially, NBTI caused VT shift will be improved relative to a 100% duty factor.

Although input data signals 4 are shown being sourced by controller 16, and signal 11 is shown as being received by controller 16, in this context, controller 16 will be understood to include all sources of input data signals 4 and all sinks of signals 11. As will be understood by those skilled in the art, logic components not directly required for controlling input phase select 1 and output phase select 3 can be considered to be outside of the controller. For example, if storage element 2 is an SRAM and controller 16 is an ABIST controller, although input data signals 4 and signals 11 are coupled to controller 16 for test purposes, input data signals 4 may alternatively (such as through a multiplexer) be sourced by other logic, and, likewise, signals 11 would be coupled to other logic and/or registers. In an embodiment, input data signals 4 are sourced by logic that is not related to logic that specifically controls phase mode and/or clock. In an embodiment, signals 11 are not coupled to logic that specifically controls phase mode and/or clock. However, if input data signals 4 and signals 11 are not coupled to controller 16, controller 16 is unable to change the phase of storage element data in storage elements 2. Changing the phase of storage element data in storage elements 2 is important if phase mode changes value while storage element data stored in storage element 2 is required by logic coupled to output phase select 3.

Figure 3:
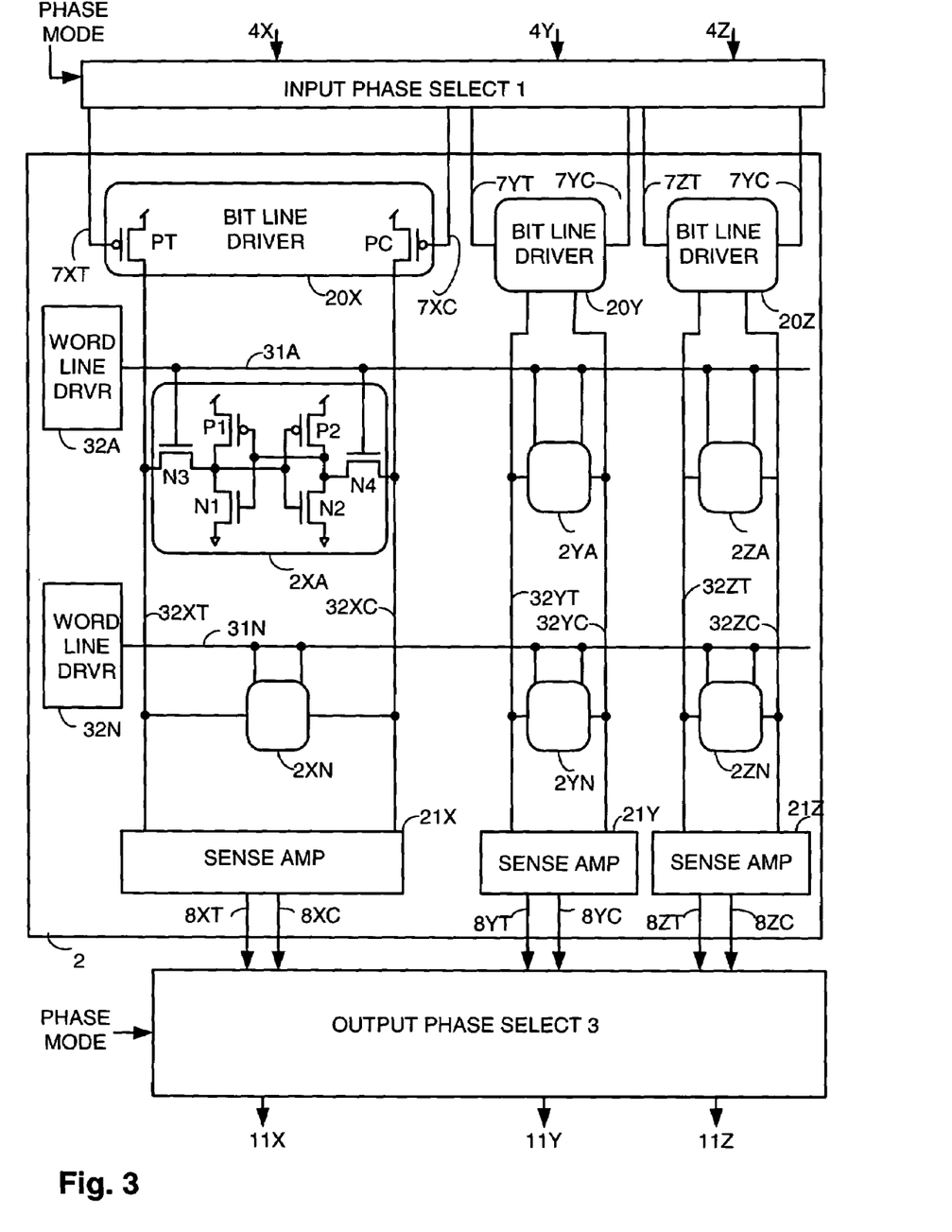
FIG. 3 is a block diagram of an exemplary memory array embodiment of a storage element according to an embodiment of the present invention.

FIG. 3 is a block diagram of an embodiment of the invention wherein the storage element 2 is a memory array, specifically, an SRAM. DRAM memory arrays share many common blocks such as bit line drivers, word line drivers, and sense amplifiers, and an SRAM is used only for exemplary purposes and is not intended to be limiting. Input data signals 4X, 4Y, 4Z are individual instances of input data signal 4, and are data to be stored in the SRAM. Input phase select 1 is controlled by phase mode to select a true or complement phase of input data signals 4X, 4Y, 4Z to be driven as inputs (7XT, 7XC), (7YT, 7YC), and (7ZT, 7YC). 7XT, 7YT, and 7ZT control "true" bit line driver PFETs; 7XC, 7YC, and 7ZC control "complement" bit line driver PFETs, as shown. Assume that phase mode is "1", meaning that a "true phase" of input data (e.g., 4X) is to be stored. When signal 4X is "1", signal 7XT is "0", causing PFET PT of bit line driver 20X to drive bit line 32XT to "1". (Note that inputs (7XT, 7XC), (7YT, 7YC), (7ZT, 7ZC) are also controlled by a write clock (not shown) so that all of these inputs are held "high" unless a write is being done. In other words, when a write is not being done, PT and PC of bit line driver 20X are held off, e.g., nonconducting.) Bit line 32XC is driven (or had previously been driven) low by an NFET (not shown, for simplicity). PFET PT in this voltage bias condition is stressed for NBTI caused VT shift, having a low voltage on its gate, and having its source high, and its drain high (once bit line 32XT is charged high). Bit line 32XT is coupled to all memory cells 2XA–2XN in the "X" column.

Word line drivers 32A–32N receive addresses (not shown) and a clock (not shown). Each word line driver raises its respective word line when an address unique to that word line driver is received, and when the clock is active. For example, word line driver 32A raises word line 31A when an address of '0000'B is received by the SRAM and the clock is active (a 4-bit address characteristic of a 16 word SRAM). When word line 31A rises, NFETs N3 and N4 conduct. Continuing the example where bit line 32XT is "1" and 32XC is "0", N3 raises the common drain node of PFET P1 and NFET N1; N4 pulls down the common drain node of PFET P2 and NFET N2, writing a "1" into memory cell 2XA. As long as a "1" remains in memory cell 2XA, PFET P1 is in a voltage bias condition that stresses NBTI caused VT shift. P2 has a gate at a high voltage, a source at a high voltage, and a drain at a low voltage, which is not in a voltage bias condition that stresses NBTI caused VT shift. In the voltage conditions explained in the example, PFET P2 of memory cell 2XA and PFET PC of bit line driver 20X tend to recover from any NBTI caused VT shift; PFET PT of bit line driver 20x and PFET P1 of memory cell 2XA are in a voltage bias that stresses (causes) NBTI caused VT shift. In an electronic system, such as a computer processor, many memory cells are frequently written to, sometimes with "1" data and sometimes with "0" data and therefore have a duty cycle fairly "close" to 50%, and NBTI caused VT shift is usually acceptable for such memory cells. However, other memory cells are written into with almost totally static data, such as operating system code that is seldom, if ever, changed, even when restarts of the system occurs. PFETs in such memory cells (and PFETs in associated bit line drivers and word line drivers) have performance seriously degraded by NBTI caused VT shifts. Typically, memory arrays are tested and/or "burned in" at elevated voltages and/or elevated temperatures. Both elevated voltage and elevated temperatures accelerate NBTI caused VT shifts. ABIST (Array built in self test) patterns are applied during such testing and "burn-in" procedures. Although the patterns provided are intended to find defects in the memory array, there is no guarantee that anywhere near a 50% duty factor will be applied to any bit line, word line, or memory cell in the memory array embodiment of the storage element. Controller 16 (not shown in FIG. 3) periodically changes the value of phase mode as will be described later, providing a duty factor closer to 50% for all the PFETs in the memory array that would normally have static data, or have ABIST-generated data that varies greatly from a 50% duty factor.

FIG. 3 shows details of bit line driver 20X; bit line drivers 20Y and 20Z are of similar construction. FIG. 3 shows details of memory cell 20XA; memory cells 2YA and 2ZA are memory cells of like construction to memory cell 20XA and store other storage data in the same word (i.e., word A, enabled by word line 31A). Memory cells 2XN, 2YN, and 2ZN are similar memory cells, storing storage data in word N, being coupled to word line 31N. Sense amplifiers 21X, 21Y, and 21Z sense bit lines (32XT, 32XC), (32YT, 32YC), and (32ZT, 32ZC) respectively during a read of storage element 2. Sense amplifiers 21X, 21Y, and 21Z output signals (8XT, 8XC), (8YT, 8YC), and (8ZT, 8ZC) complementary signal pairs, respectively.

Output phase select 3 drives individual instances of signal 11 denoted as 11X, 11Y, 11Z that represent the true or inverse of the logical value of the (8XT, 8XC), (8YT, 8YC), and (8ZT, 8ZC) complementary pairs, the true or inverse phase selection controlled by phase mode as discussed earlier regarding output phase select 3 of FIG. 1.

Figure 4:
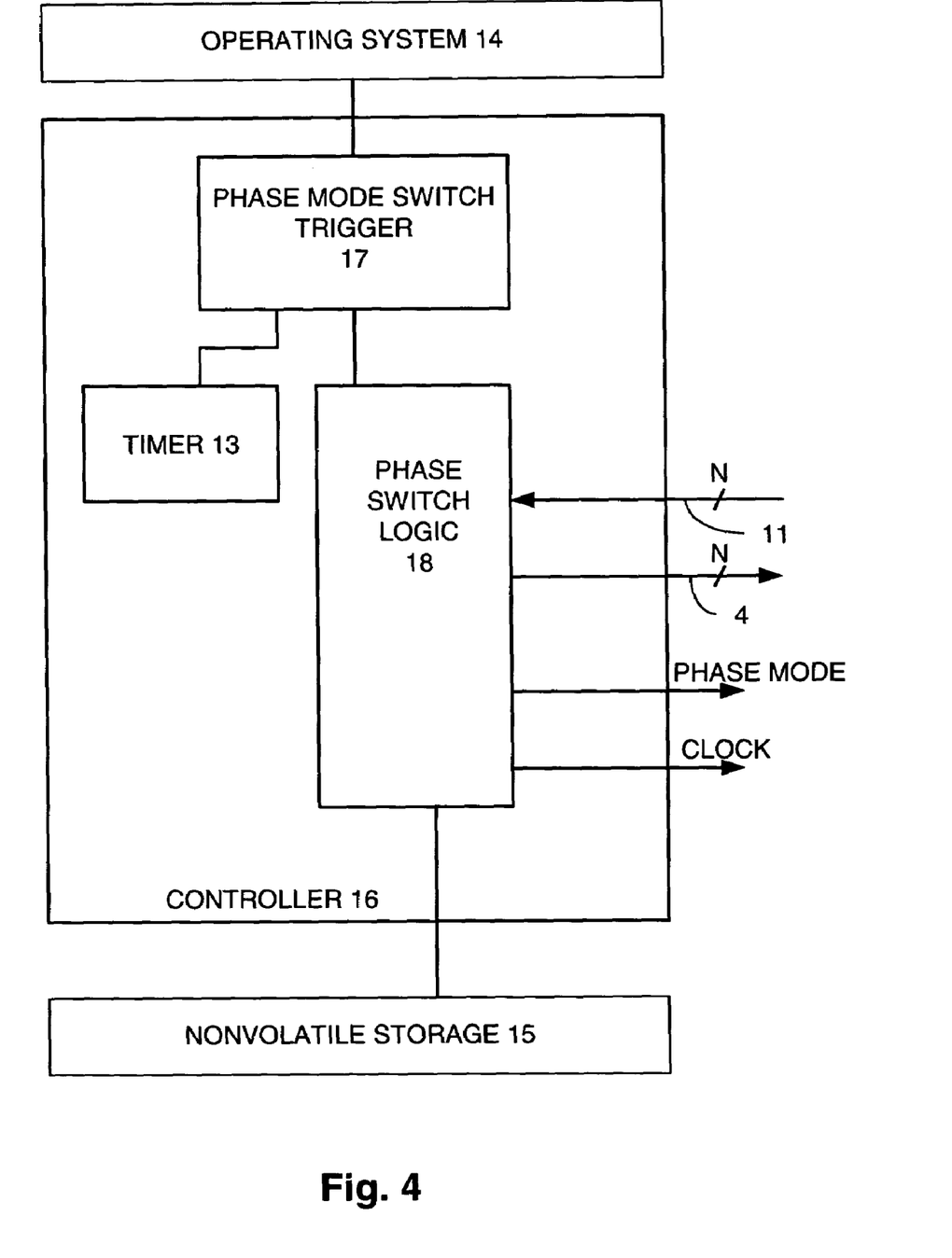
FIG. 4 is a block diagram of the controller, further showing a phase mode switch trigger and a phase switch logic.

FIG. 4 shows controller 16 in more detail. Controller 16 contains (or is coupled to) a phase mode switch trigger 17 that identifies times at which the phase mode value is to be changed. In an embodiment, phase mode is changed every time the electronic system is restarted. Operating system 14, in communication with controller 16, informs phase mode switch trigger 17 of a restart. Phase mode switch trigger 17 responds by changing phase mode from a first value to a second value, for example, from a logical "1" to a logical "0". Restarts of electronic systems do not always occur at equal intervals, and embodiments of the invention provide for inhibiting a change of phase mode unless a predetermined time has elapsed, even if a restart occurs. Sometimes an electronic system may be restarted and operated for days, weeks, or even months, while upon a subsequent restart the electronic system is operated only minutes until yet another restart is performed. In an embodiment, phase mode switch trigger 17 is coupled to nonvolatile storage 15. Nonvolatile storage 15, in various embodiments, is a magnetic disk, a flash memory, a writeable optical disk, or a ferroelectric memory. Any form of nonvolatile storage is contemplated. In an embodiment, upon a restart, controller 16 writes a time (supplied by an operating system or other suitable source of time) of the restart, and, optionally, the current value of phase mode. It will be understood that the controller writing the time of the restart is only an exemplary embodiment, and, in other embodiments, other portions of the electronic system may write the time of the restart and, optionally the current value of phase mode. Upon a subsequent restart, phase mode switch trigger 17 reads nonvolatile storage 15, compares a current time against the previous restart time, and if the elapsed time is less than a predetermined time interval, phase mode switch trigger 17 does not change phase mode. If the elapsed time is greater than the predetermined time interval, phase mode switch trigger 17 does change phase mode. For example, suppose the predetermined time interval is one month. If the electronic system is restarted five times during the month, phase mode is not changed upon any of the five restarts. However, phase mode will be changed at the first restart that occurs after the month long predetermined time interval has elapsed. The predetermined time is determined by consideration of expected system use characteristics such as temperature, time between restarts, and how fast NBTI caused VT shifts accumulate in a given technology. Shorter values for the predetermined time interval are used under conditions or technology processes in which NBTI caused VT shifts accumulate faster.

Some electronic systems are almost never restarted and operate continuously for extended periods of time, perhaps many years. In an exemplary embodiment shown in FIG. 4, controller 16 contains (or is coupled to) timer 13. Phase mode switch trigger 17 is coupled to timer 13 and at predetermined timer intervals changes phase mode. Controller 16 has to take special action when changing phase mode at times other than restarts, since some storage elements 2 will contain storage element data that was earlier written with a first value of phase mode that would be read incorrectly with a second value of phase mode. (Several exemplary embodiments of storage elements 2 have been given earlier, as well as of input phase selects 1 and output phase selects 3). To accommodate this special action requirement, phase switch logic 18 reads all such storage element data using signals 11 from the associated output phase select 3 blocks prior to changing phase mode and rewrites the data in the opposite phase on input data signals 4 to the associated input phase selects 1 of storage elements 2 prior to changing phase mode. In many embodiments, the process of rewriting the data in the opposite phase into storage elements 2 cannot be done "all at once". For example, if storage element 2 is an SRAM or a DRAM, controller 16 must sequentially read out each word and write each word back into the SRAM or DRAM. The present invention contemplates such time multiplexing to change the phase of storage element data. In another embodiment (not shown), storage element 2 is capable of inverting its own data under control of an invert (or toggle) input. In such an embodiment, controller 18 does not require inputs 11 and outputs 4, but rather simply sends an invert signal to all storage elements 2 that must have their storage data inverted prior to use. Use by other logic dependent on storage element data must be inhibited during this process of inverting storage element data. Inhibiting use of data from a storage element is well known and is commonly practiced, for example, during DRAM refresh operation. Shorter predetermined time intervals ensure a duty factor closer to 50%. For example, an extremely short predetermined time interval would ensure a duty factor very close to 50%, but at the cost of frequently interrupting the electronic system while storage element data in storage elements 2 are inverted, during which time logic requiring the storage element data waits for the inversion to occur. This would be analogous to a DRAM having an extremely short data retention, and therefore needing very frequent refreshes, during which logic must wait for a completion of each refresh. Considerations for a duration of the predetermined time interval include rate at which NBTI caused VT shifts occur in a given technology, temperature under which the electronic system operates, voltage under which the electronic system operates, and the amount of NBTI caused VT shift that can be tolerated.

Figure 5:
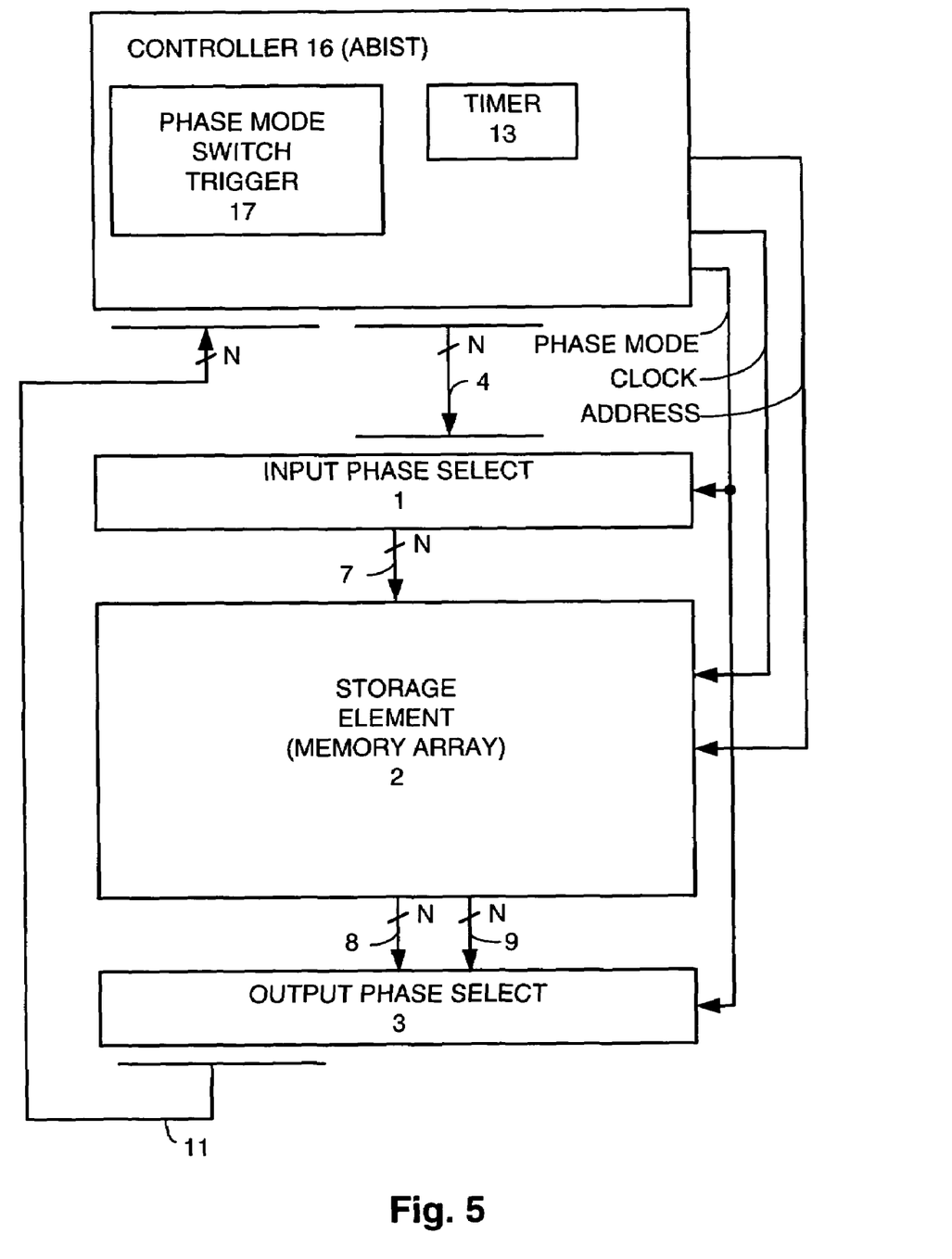
FIG. 5 is a block diagram of a memory array storage element coupled to a controller capable of providing array built in self test function.

In an embodiment where storage element 2 is a memory array, such as is shown in FIG. 3, ABIST patterns are applied as shown in FIG. 5. Controller 16 is an embodiment of a controller 16 that is an ABIST controller. Input data signals 4 couple data from controller 16 to input phase select 1. Input phase select 1 is controlled by phase mode to select a true or inverted phase of each input data signal in data signals 4. Storage element 2 is a memory array, such as storage element 2 as shown in FIG. 3. Outputs 8 and 9 are the true and complement signals driven out of storage element 2, such as signals (see FIG. 3) 8XT, 8YT, and 8ZT and complement signals 8XC, 8YC, and 8YC. Output phase select 3 selects a phase of outputs 8 and 9 for output on signals 11. Signals 11 are coupled back to controller 16 (and may be coupled to other logic as well, not shown). Controller 16 in addition, provides address patterns and clock to storage element 2. A phase mode switch trigger 17 in controller periodically changes phase mode to ensure an improved duty factor of data stored in each memory cell of storage element 2. In an embodiment, phase mode switch trigger 17 changes phase mode when controller 16 begins a set of ABIST patterns (i.e., data and address patterns) designed to detect defects in storage element 2. If the set of ABIST patterns is applied twice, phase mode will have a first value during the first application of ABIST patterns, and will have a second value during the second application of ABIST patterns, thus guaranteeing a 50% duty factor. If the set of ABIST patterns are applied three times, phase mode will have a first value during the first and third application of ABIST patterns, and will have a second value during the second application of ABIST patterns, thus guaranteeing a 66.7% duty factor (in which the first value of phase mode is active). In a second embodiment, phase mode switch trigger 17 changes phase mode when controller 16 ends a set of patterns designed to detect defects in storage element 2. In a third embodiment, phase mode is changed at the beginning of (or at the end of) a predetermined number of applications of the set of patterns designed to detect defects in storage element 2. Depending on the number of times the ABIST patterns are applied, various duty factors would result. For example, if phase mode is changed at the beginning of every fourth application of the set of ABIST patterns, but the set of ABIST patterns is applied only five times, phase mode will have a first value during the first four applications of the set of ABIST patterns, and a second value for the fifth application of the set of ABIST patterns, thus guaranteeing an 80% duty factor (in which the first phase mode value is active). The present invention contemplates any duty factor assuming multiple applications of the set of ABIST patterns and choice of the number of applications of the set of ABIST patterns before changing the phase mode. In yet another embodiment, phase mode is changed at the beginning of (or at the end of) one or more applications of the set of patterns designed to detect defects in storage element 2 if a predetermined period of time has elapsed, as indicated by timer 17.

Figure 6A:
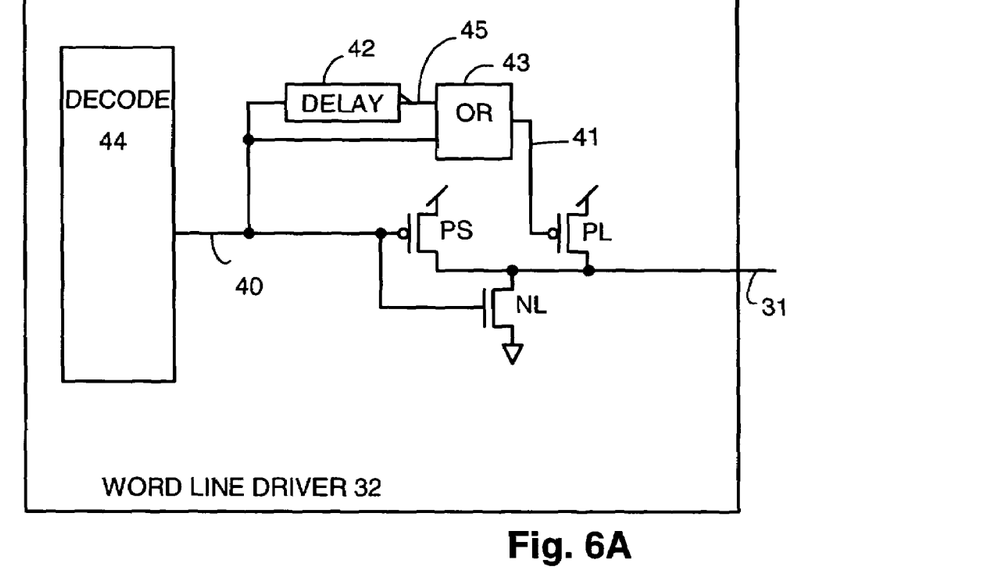
FIG. 6A depicts a word line driver suitable for use in a memory array storage element according to an embodiment of the present invention.
Figure 6B:
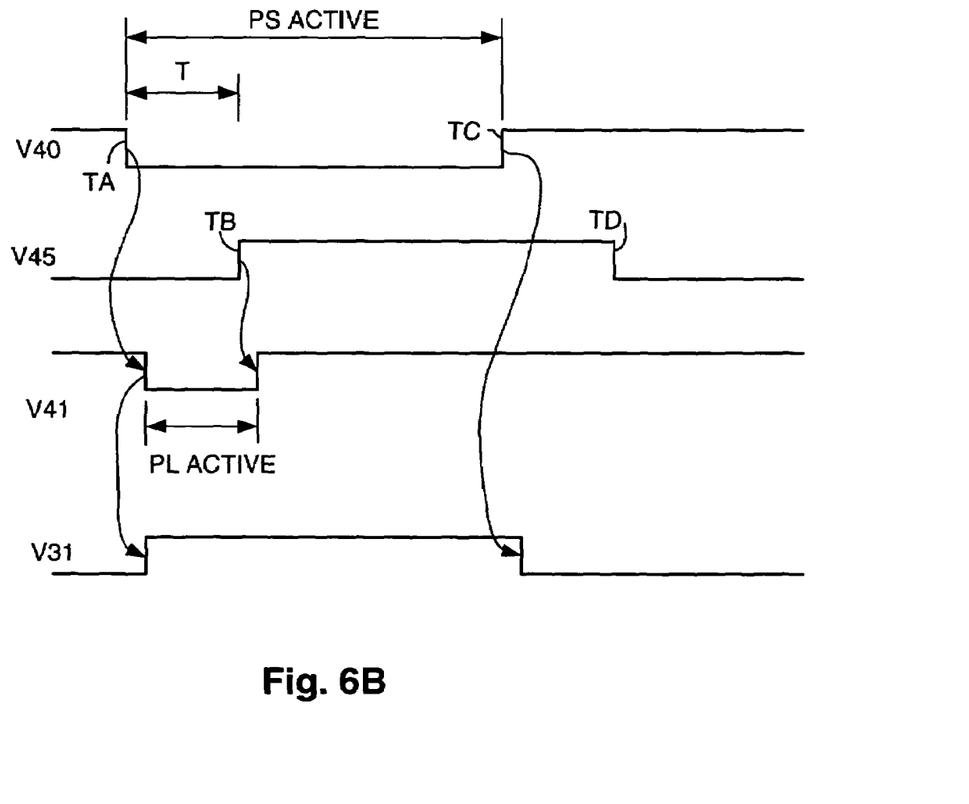
FIG. 6B shows signal voltage waveforms of nodes shown in FIG. 6A.

FIG. 6A shows an embodiment of word line driver 32 that reduces NBTI caused VT shift in a memory array embodiment of storage element, such as, but not limited to, the SRAM storage element 2 shown in FIG. 3. FIG. 6B shows wave forms at nodes in FIG. 6A. Word lines in memory array storage elements can not be phase inverted without significant changes to the construction of the memory array storage element. In the exemplary memory array storage element 2 of FIG. 3, a word line 31A–31N rises when an address corresponding to that word line is input to the storage element, and when a clock is active. A PFET in word line driver 32A–32N must raise the addressed word line. That PFET will experience NBTI caused VT shift when the word line is high. During normal operation of the memory array storage element, as well as during ABIST, some word lines will be high much more than other word lines. The word line driver 32 of FIG. 6A has a decode 44 that receives address (not shown) and clock (not shown) and causes signal 40 to fall when word line 31 needs to be pulled high. A pulse generator circuit consisting of inverting delay 42, and OR 43 provides a pulse that is coupled on signal 41 to a gate of a large PFET PL. It will be understood that other embodiments of pulse generators are equally suitable. PL is capable of driving word line 31 to a high level within a required time. The pulse produced on signal 41 when signal 40 falls is sufficient to ensure that PL charges word line 31 to a required voltage. After a delay provided by inverting delay 42, OR 43 causes signal 41 to rise, ending the pulse, and turning off PL, ending the time that PL is in an NBTI caused VT shift stress condition. When signal 40 is at a low voltage, a small PFET PS, conducts. PS needs only to be large enough to supply leakage current from word line 31. NFET NL conducts when signal 40 is high; discharging word line 31 to a low voltage.

FIG. 6B illustrates the operation of word line driver 32. V40 is a voltage waveform at signal 40; V45 is a voltage waveform at signal 45 (an output of inverting delay 42); V41 is a voltage waveform at signal 41; V31 is a voltage waveform at word line 31. V40 falls at time TA, causing OR 43 to respond by pulling signal 41 low, turning on PL, which pulls word line 31 (V31) high. After T, the delay of inverting delay 42, V45 rises at time TB (inverting delay 42 is an inverting block, indicated by the wedge at its output); OR 43 responds by raising signal 41 and turning off PL. PS conducts from the time signal 40 falls to the time signal 40 rises. At time TC, signal 40 rises, turning off PS and turning on NL, which pulls word line 31 low. NBTI caused VT shifts of PS are not critical, since PS is not significantly responsible for driving word line 31 high, a VT shift of PS does not materially degrade performance or reliability of memory array storage element 2 or other embodiments of a memory array storage element. PL is only in a voltage bias condition that stresses NBTI caused VT shift for a relatively short period each time word line 31 is high.

Figure 6C:
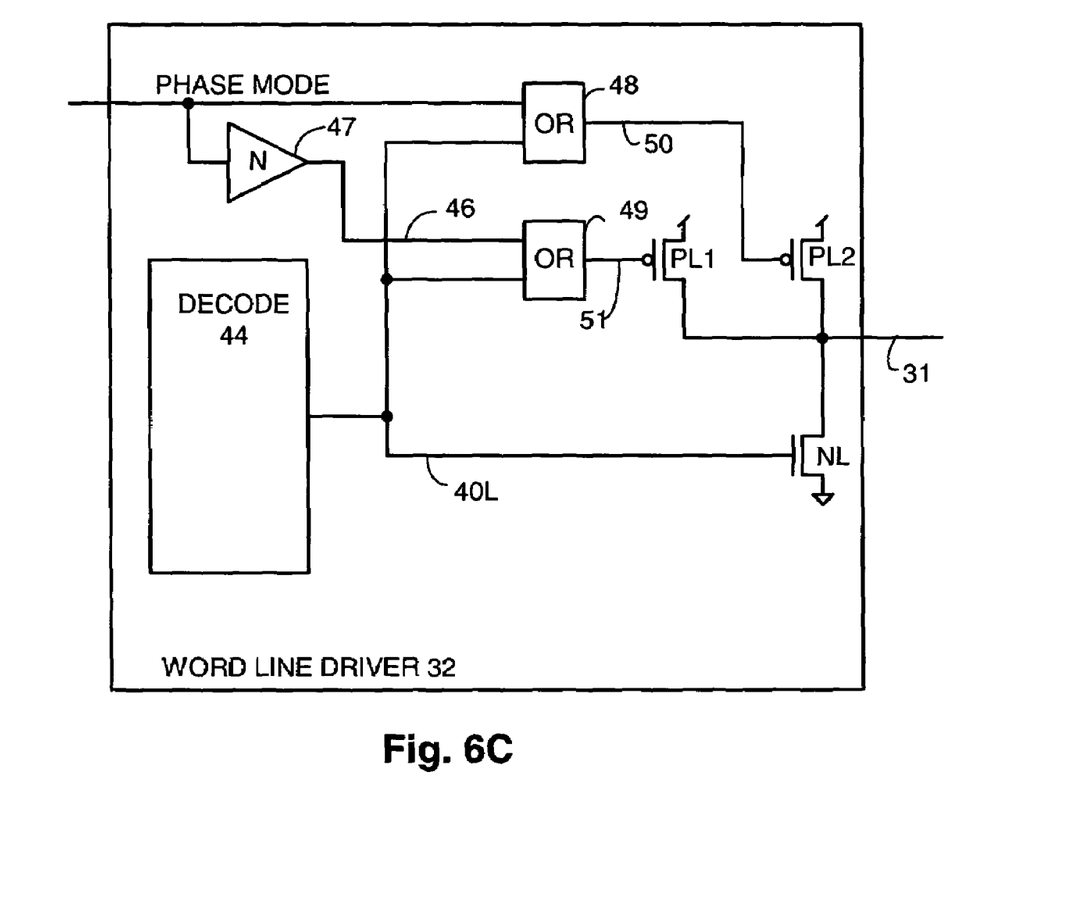
FIG. 6C shows another embodiment of a word line driver suitable for use in a memory array storage element according to an embodiment of the present invention.

FIG. 6C shows a second embodiment of word line driver 32 having reduced NBTI caused VT shifts. Word line driver 32 includes a decode 44 that drives signal 40L low when word line 31 is addressed (address lines not shown) and a clock (not shown) is active. Signal 40L is coupled to first inputs of ORs 48 and 49. A second input of OR 48 is coupled to phase mode. An inverted copy of phase mode, produced by inverter 47, is coupled by signal 46 to a second input of OR 49. OR 48 drives signal 50 low, turning on PFET PL2, when phase mode is "0" and 40L is low (i.e., "0"). PL2 drives word line 31 high when PL2 is turned on and conducts. Inverted copy of phase mode, signal 48 causes OR 49 to drive signal 51 high when phase mode is "0", keeping PL1 out of an NBTI caused VT shift voltage stress condition. However, when phase mode is "1", in a manner similar to the above, PL1 drives word line 31 high when signal 40L is low. When phase mode is "1", PL2 is kept out of an NBTI caused VT shift voltage stress condition. Although phase mode is shown as a single signal, in another embodiment (not shown), phase mode includes more than one signal, and conventional Boolean logic is used to spread the NBTI caused VT shift voltage stress condition among more than the two PFET devices shown as PL1 and PL2 in FIG. 6C. For example, if two phase mode signals are used, one of four PFET devices can be selected to drive word line 31 high.

Storage elements 2 that are memory arrays such as SRAMs and DRAMs are often designed to have all bit lines (e.g., 32XT, 32XC) "high" when no read or write operation is being performed, that is, when the storage element is not selected by a storage element select signal. Additional pull-up FETs (PFETs) are used to drive both phases of bit lines high.

Figure 6D:
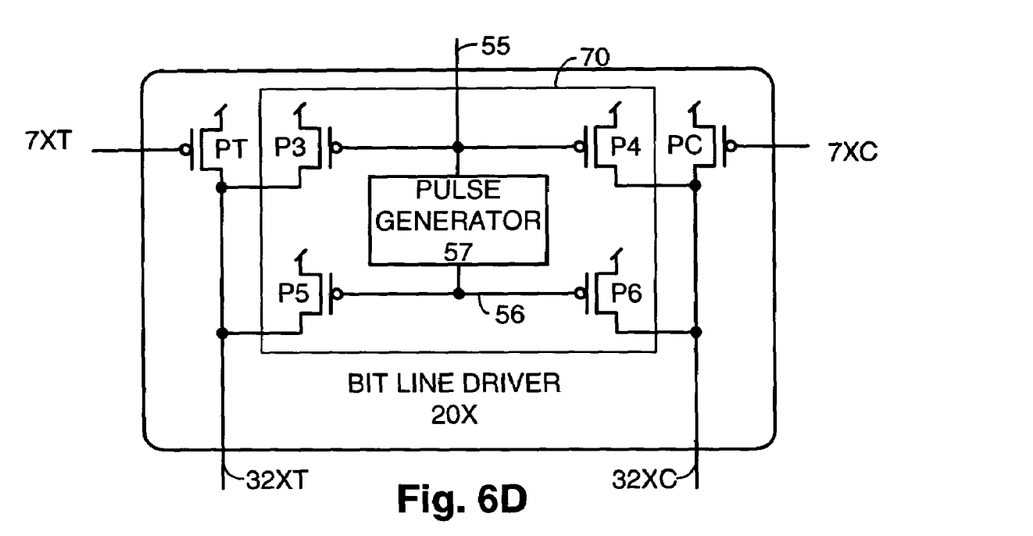
FIG. 6D shows an embodiment of a bit line driver having a restore function with improved NBTI caused VT shift characteristics.

FIG. 6D shows an embodiment of bit line driver 20X having a restore function 70 that reduces NBTI caused VT shift in large PFET devices P5 and P6. P5 and P6 quickly charge both true phase and complement phase bit lines (i.e., 32XT and 32XC) high (i.e., to a voltage supply, usually called Vdd) when select 55 becomes inactive (i.e., goes to a "low" voltage). A pulse generator 57, similar to the pulse generator comprising inverting delay 42 and OR 43 in FIG. 6A(or alternative pulse generator) produces a negative pulse of predetermined pulse width when select 55 becomes inactive. The predetermined pulse width is designed to be sufficient to guarantee that P5 and P6 can drive bit line 32XT and 32XC, respectively, high. Although select 55 typically is "low" for long periods of time, P5 and P6 are only put into an NBTI caused VT shift voltage stress for a short period of time (i.e., the pulse width of pulse generator 57) each time select 55 goes inactive. To hold bit lines 32XT and 32XC "high" when select is inactive, small PFETs P3 and P4 conduct whenever select 55 is inactive. P3 and P4 need only be large enough to supply any leakage currents from bit lines 32XT and 32XC, respectively. P3 and P4 do not contribute significantly to charging bit lines 32XT and 32XC, and therefore, an NBTI caused VT shift in P3 and P4 is not a concern.

Figure 6E:
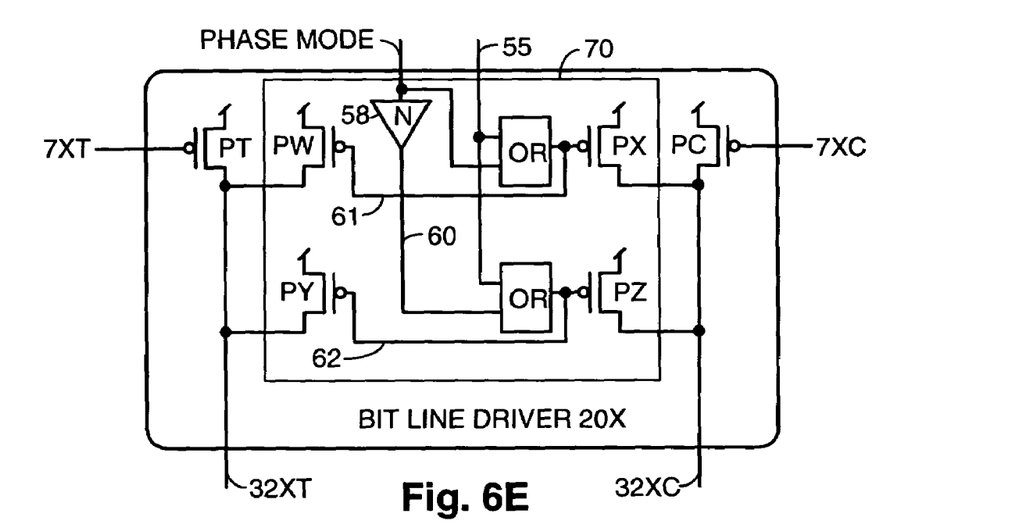
FIG. 6E shows a second embodiment of a bit line driver having a restore function with improved NBTI caused VT characteristics.

FIG. 6E shows an embodiment of bit line driver 20X having a different embodiment of restore 70. Restore 70 in FIG. 6E receives phase mode. When phase mode has a value of "1", inverter 58 drives a "0" to a first input of OR 73, which then passes select 55 (coupled to a second input of OR 73) to large PFETs PY and PZ, on signal 62. PY and PZ are large enough to drive bit lines 32XT and 32XC high within a required time. However, PY and PZ are in an NBTI caused VT shift voltage stress condition when select is inactive and phase mode is "1". During this time, PW and PX each have their gate voltage "high" and therefore are not in an NBTI caused VT shift voltage stress. As taught earlier, phase mode is changed by phase mode switch trigger 17 upon occurrence of a prespecified event. When phase mode is changed, (e.g., from "1" to "0" in the example of this paragraph) large PFETs PW and PX drive bit lines 32XT and 32XC high and hold them high when select 55 is inactive. While PW and PX are active, they are in an NBTI caused VT shift voltage stress, but PY and PZ are not in such stress. PW and PY, in other words, form a first plurality of FETs, each capable of charging bit line 32XT within a required restore time. Phase mode controls whether PW or PY will be turned on when select 55 goes inactive. Similarly, PX and PZ form a second plurality of FETs, each capable of charging bit line 32XC within the required restore time. Phase mode controls whether PX or PZ will be turned on when select 55 goes inactive. This embodiment shows NBTI caused VT shift voltage stress time being divided between two groups of PFETs (i.e., PY and PZ in a first group, and PW and PX in a second group). In an embodiment of the present invention in which phase mode has more than a single signal, more than two groups are contemplated.

Many storage elements 2 that are memory arrays, such as SRAMs and DRAMs also have an equalization function that connects the true and complement bit lines together through an FET when the storage element is not selected. The equalization function serves to make sure that both bit lines are at substantially the same voltage. A second purpose of the equalizer function is to provide a parallel conducting path for charging up a bit line that has been driven low during a read or a write prior to select going inactive.

Figure 6F:
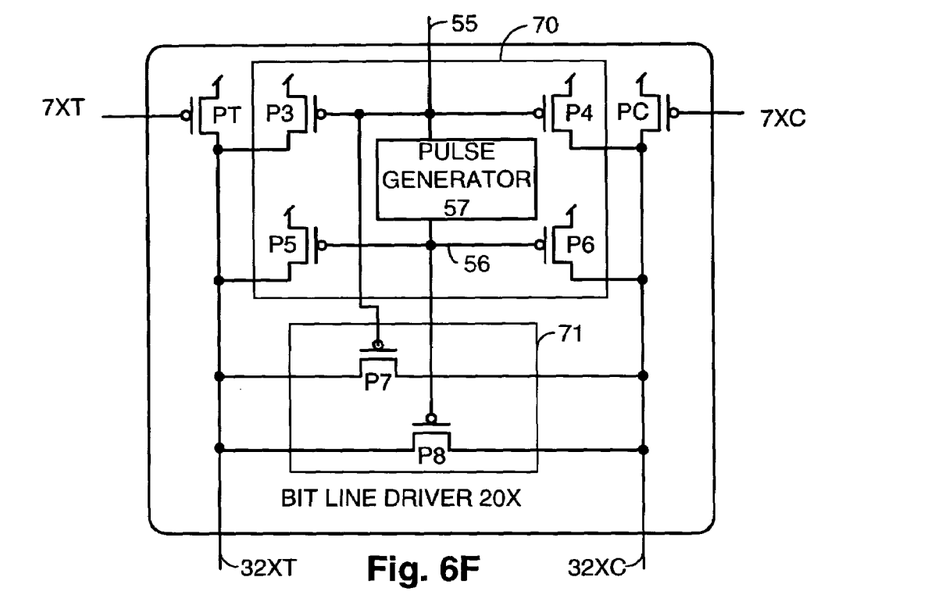
FIG. 6F shows an embodiment of a bit line driver having a restore function with improved NBTI caused VT shift characteristics as in FIG. 6D and a bit line equalization function having improved NBTI caused VT characteristics.

FIG. 6F shows an embodiment of bit line driver 20X having the same embodiment of restore function 70 shown in FIG. 6D, and also having an embodiment of equalization function 71 suitable for efficient use with restore function 70. Signal 56 is driven low for a predetermined pulse width by pulse generator 57 when select 55 goes inactive, as described above. When signal 56 is low, a large equalization PFET P8 conducts, making a low impedance path between bit line 32XT and bit line 32XC. Suppose bit line 32XT had been a "0" as a result of a write (or a read). 32XT is charged up by P5, in parallel with the series combination of P8 and P6 as long as P8 conducts (i.e., while signal 56 is "0"). Small equalization PFET P7 provides a higher impedance path between bit line 32XT and 32XC, and maintains the higher impedance path as long as select 55 is "0". P7 is optional in storage elements where a Vdd supply voltage coupled to sources of P3, P4, P5, and P6 can be maintained at substantially the same voltage on each source (i.e., power supply voltage distribution drops are not significant).

Figure 6G:
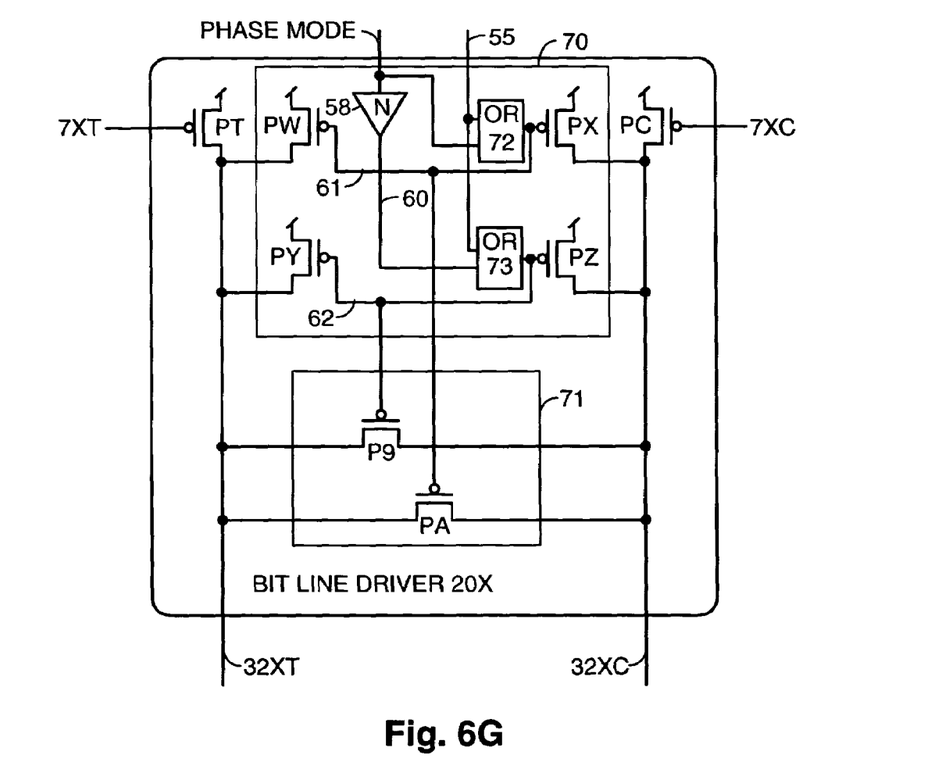
FIG. 6G shows an embodiment of a bit line driver having a restore function with improved NBTI caused VT shift characteristics as shown in FIG. 6E, and a bit line equalization function having improved NBTI caused VT characteristics.

FIG. 6G shows an embodiment of bit line driver 20X having an embodiment of restore function 70 as shown in FIG. 6E and described above, as well as an embodiment of equalization function 71 suitable for efficient use with the depicted embodiment of restore function 70. P9 is a first equalization PFET suitable to assist PY (series charging path through P9 and PZ) in charging bit line 32XT when select 55 falls to "0". P9, PY, and PZ all conduct when phase mode has a value of "1" and select 55 is "0". If bit line 32XT had been "0" prior to select going inactive, bit line 32XT is charged up by PY in parallel with the series combination of P9 and PZ. P9 will be in an NBTI caused VT stress voltage condition whenever phase mode is "1" and select 55 is "0"; however, second equalization PFET PA (similarly to PFETs PW and PX) will have its gate at a "1" and therefore not be stressed. When phase mode is "0", PA forms a low impedance connection between bit line 32XT and 32XC, and works in conjunction with PW and PX in a manner similar to P9 working in conjunction with PY and PZ. As in the discussion regarding FIG. 6E, if phase mode has multiple bits, NBTI caused VT shift stress voltage can be shared by more than the two equalization PFETs P9 and PA.

Figure 7:
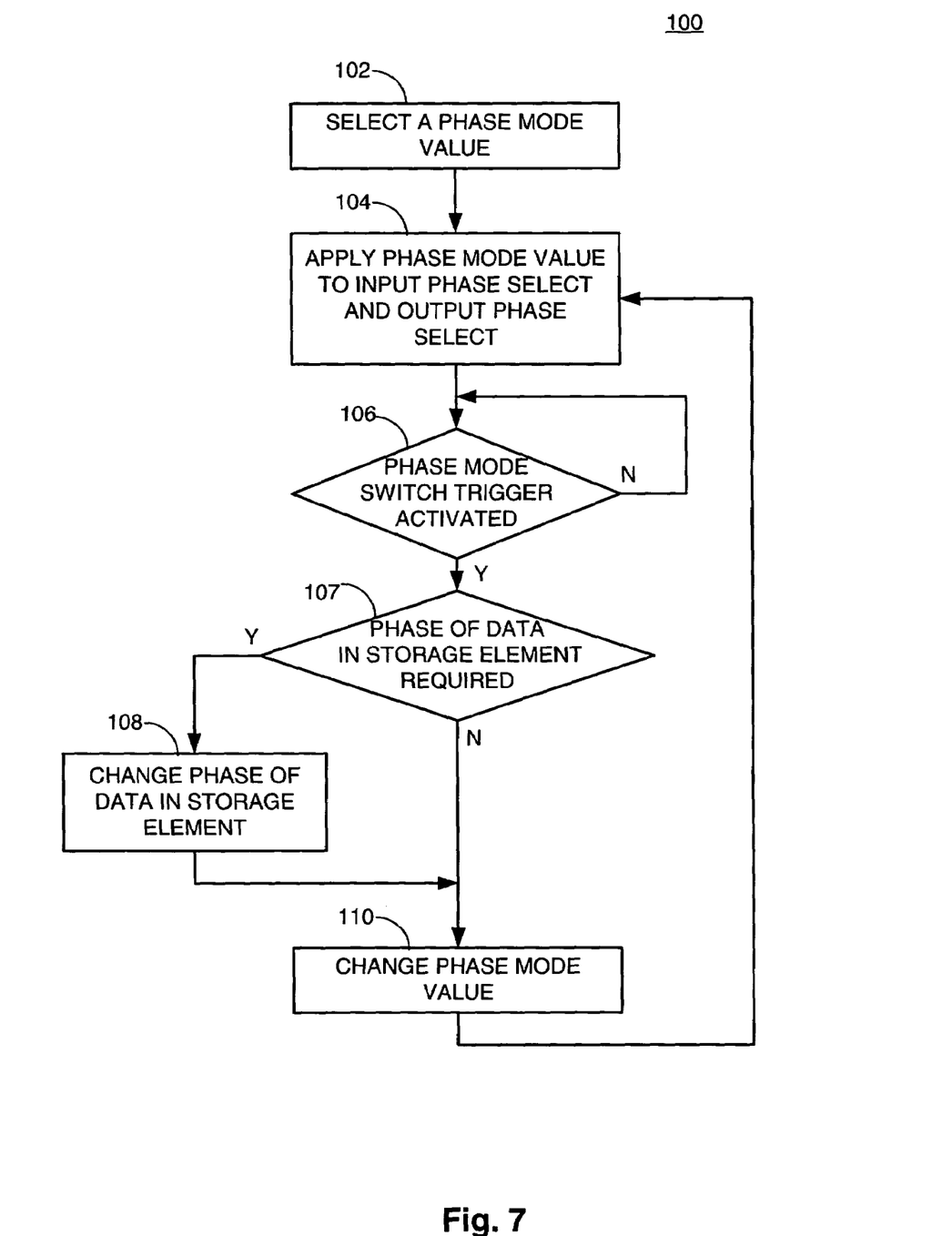
FIG. 7 is a flowchart of an embodiment of a method of the present invention.

FIG. 7 shows a method embodiment of the present invention. In step 102, a phase mode value is selected. An initial value for phase mode can be chosen at random, or designed into the electronic system. In step 104, the phase mode value is applied to one or more input phase select blocks of logic on a semiconductor chip, as well as one or more output phase select blocks of logic on the semiconductor chip. The value of the phase mode determines whether "true" or "complement" data is stored in one or more associated storage elements on the semiconductor chip. In step 106, the electronic system operates, with data being written to and read from the one or more storage elements on the semiconductor chip. However, a phase mode switch trigger awaits an event such as a restart; a restart after at least a predetermined time interval since a previous restart; an elapse of a predetermined time interval; beginning or completion of an ABIST set of patterns; beginning or completion of a predetermined number of applications of an ABIST set of patterns; beginning or completion of one or more applications of an ABIST set of patterns and elapse of a predetermined time interval. The phase mode switch trigger activates upon detection of one or more of such events, passing control to block 107. If the current phase of storage element data is required by logic in the electronic system, control is passed to block 108; otherwise, control is passed from block 107 to block 110. Block 108 is required in electronic systems wherein the phase mode switch trigger activates when the one or more storage elements contain storage data required by logic on the electronic system. If so, block 108 changes the phase in all storage elements having an input phase select and an output phase select. As described earlier, not all storage element data need be phase changed at the same time. In particular, some storage elements, such as SRAMs or DRAMs take a number of cycles to change the phase of each bit (or group of bits) in a time multiplexed fashion. If the phase mode switch trigger only triggers on restarts, blocks 107 and 108 is not required, since storage data in the one or more storage elements will be rewritten after the restart. In block 110, phase mode value is changed, and control passes to step 104, where the new phase mode value is applied to all input phase selects and all output phase selects. In some embodiments of the invention, such as was illustrated in FIG. 6C and described above, phase mode is also used in the storage element to reduce NBTI caused VT shifts in word line drivers.

Time in which the electronic system operates with phase mode having the first value is time in which the electronic system is in a first state, in which storage elements controlled by phase mode store data in a first phase (e.g., "true" data). Time in which the electronic system operates with phase mode having the second value is time in which the electronic system is in a second state, in which storage elements controlled by phase mode store data in a second phase (e.g., "complement" state). The method ensures that, over a period of time in which NBTI caused VT shifts are significant, at least a first portion of a total operational time of the electronic system is spent in the first state, accumulating a first total time in which the electronic system is in the first state; and further ensures that at least a second portion of the total operational time of the electronic system is spent in the second state, accumulating a second total time in which the electronic system is in the second state. In an embodiment of the invention, the method described above makes the first total time similar to a second total time. For example, when the controller is an ABIST controller, and the event that activates the phase mode switch trigger is a beginning of the set of ABIST patterns, if the set of ABIST patterns is executed an even number of times, the first total time will be virtually identical to the second total time (assuming the set of ABIST patterns is repeated at the same speed and no "wait times" occur). If the set of ABIST patterns is executed an odd number of times, say 51, the electronic system will have been in the first state during 26 executions of the set of ABIST patterns, and in the second state during 25 executions of the set of ABIST patterns, and the first total time and the second total time differ only slightly. If the event that activates the phase mode switch trigger is a timer that activates the phase mode switch trigger once a month, the first total time and the second total time will never differ by more than one month. Even if the first total time is twice or even four times the second total time, significant improvement in the NBTI caused VT shift is achieved versus having a total time spent in a single state, (i.e., storage elements always storing the same phase of storage element data). The present invention contemplates any improvement in duty factor achieved through the methods described above.

While the foregoing is directed to embodiments of the present invention, other and further embodiments of the invention may be devised without departing from the basic scope thereof, and the scope thereof is determined by the claims that follow.

What is claimed is:

1. A method to reduce bias temperature instability (BTI) caused threshold voltage (VT) shifts in a field effect transistor (FET) used in an electronic system comprising the sequential steps of:
   setting a phase mode to a first value;
   using the first value of the phase mode to select a first phase of an input data signal for storage into a storage element;

using the first value of the phase mode to select a first phase of storage element data as output data;

activating a phase mode switch trigger;

respondent to the phase mode switch trigger activation, changing the phase mode to a second value;

using the second value of the phase mode to select a second phase of the input data signal for storage into the storage element; and using the second value phase mode to select a second phase of storage element data as output data.

2. The method of claim 1, wherein the activating the phase mode switch trigger occurs when a restart of the electronic system occurs.

3. The method of claim 2, further including the sequential steps, following activating the phase mode switch trigger, of:

reading from a nonvolatile storage a previous phase mode value;

setting the phase mode value to be different from the previous phase mode value; and updating the previous phase mode value in the nonvolatile storage to the phase mode value set in the previous step.

4. The method of claim 3, wherein the step of activating the phase mode switch trigger further comprises the steps of:

reading from a nonvolatile storage a previous restart time;

determining an elapsed time between a current time and the previous restart time; if the elapsed time is greater than a predetermined interval, then performing the steps of:

activating the phase mode switch trigger; and updating in the nonvolatile storage the previous restart time with the current time;

if the elapsed time is less than the predetermined interval, then performing the step of inhibiting activation of the phase mode switch trigger.

5. The method of claim 1, wherein the step of activating the phase mode switch trigger occurs when an array built in self test (ABIST) set of patterns begins.

6. The method of claim 1, wherein the step of activating the phase mode switch trigger occurs at the completion of application of one or more sets of ABIST patterns.

7. The method of claim 1, wherein the step of activating the phase mode switch trigger occurs when an array built in self test (ABIST) set of patterns begins and a predetermined time interval has elapsed since a previous set of ABIST set of patterns began.

8. The method of claim 1, wherein the step of activating the phase mode switch trigger occurs at the completion of application of one or more sets of ABIST patterns and a predetermined time interval has elapsed since a previous set of ABIST patterns completed.

9. The method of claim 1 wherein the step of activating the phase mode switch trigger occurs when a predetermined period of time elapses since a previous phase mode switch trigger occurred.

10. The method of claim 9, wherein the storage element data of a particular storage element is changed in phase prior to changing the phase mode respondent to the phase mode switch trigger.

11. The method of claim 10, wherein the storage element data comprises multiple bits of data, and the change in phase of the storage element data is done in a time multiplexed manner.

12. The method of claim 10, wherein use of the output data of a particular storage element is inhibited following a phase mode value change until after the storage element data of the particular storage element is inverted.

13. The method of claim 1, wherein the FET is a P-channel field effect transistor, and the bias temperature instability is a negative bias temperature instability (NBTI).

14. The method of claim 1, wherein the FET is an N-channel field effect transistor, and the bias temperature instability is a positive bias temperature instability (PBTI).

15. An electronic system comprising:

a controller having a clock output and a phase mode output;

an input phase select coupled to an input data signal, an input coupled to the phase mode, and having an input phase select output, the input phase select output being a true or complement of the logical value of the input data signal, selected by the phase mode;

a storage element having a data input coupled to the input phase select output, a clock input, and a storage element output, the clock input capable of latching the data input into the storage element;

an output phase select having an input coupled to the storage element output, an input coupled to the phase mode, and having an output phase select output, the output phase select output being a true or a complement phase of the storage element data as determined by the phase mode.

16. The electronic system of claim 15, wherein the storage element is a memory array having M rows of memory cells by N columns of memory cells.

17. The electronic system of claim 16, the storage element further comprising a bit line driver having an input coupled to the input phase select and a bit line output coupled to a bit line input of each memory cell in one column of the N columns of memory cells.

18. The electronic system of claim 17, the storage element further comprising a sense amplifier coupled to the bit line output, the sense amplifier suitable to sense a memory cell content during a read operation.

19. The electronic system of claim 18, the storage element further comprising a word line driver having one or more inputs coupled to an address input to the memory array, and a word line output coupled to a word line input of each memory cell in one of the M rows of the memory array.

20. The electronic system of claim 19, the word line driver further comprising:

a decoder having inputs coupled to the address input, an input coupled to a clock, and a decoder output;

an input coupled to phase mode;

a first PFET having a source coupled to a first voltage supply and a drain coupled to the word line output, the first PFET driving the word line output high when phase mode has a first value and the decoder output is active; and a second PFET having a source coupled to the first voltage supply and a drain coupled to the word line output, the second PFET driving the word line output high when phase mode has a second value and the decoder output is active.

21. The electronic system of claim 19, the word line driver further comprising:

a decoder having inputs coupled to the address input, an input coupled to a line clock, and a decoder output;

a large FET (field effect transistor) having a drain coupled to the word line and a source coupled to a first voltage supply;

a pulse generator having an input coupled to the decoder output and an output coupled to a gate of the large FET, the pulse generator producing a pulse respondent to a transition of the decoder output sufficiently long to cause the large FET to charge the word line substantially to the first supply voltage;
a small FET having a drain coupled to the word line and a source coupled to the voltage supply, and a gate coupled to the decoder output, the small FET capable of maintaining the word line substantially at the supply voltage;
a discharge FET of type opposite of the large FET and the small FET, having a gate coupled to the decoder output, a drain coupled to the word line, and a source coupled to a second supply.

22. The electronic system of claim 16, the storage element further comprising:
a restore function comprising:
an input coupled to a select signal, the select signal being active when the storage element is selected, and being inactive when the storage element is not selected;
a first small FET having a gate coupled to the select signal, a source coupled to a voltage supply, and a drain coupled to a true phase bit line;
a second small FET having a gate coupled to the select signal, a source coupled to the voltage supply, and a drain coupled to a complement phase bit line;
a first large FET having a source coupled to the voltage supply, a drain coupled to the true phase bit line, and a first gate;
a second large FET having a source coupled to the voltage supply, a drain coupled to the complement phase bit line, and a second gate; and
a pulse generator having an input coupled to the select signal, and an output coupled to the first gate and the second gate, the pulse generator responding to a transition on the select signal by outputting a pulse having a pulse width suitable to turn on each large FET long enough to charge the bit line coupled to the drain of the first or the second large FET.

23. The electronic system of claim 22, the bit line driver further comprising:
a small equalization FET having a source coupled to the true bit line, a drain coupled to the complement bit line, and a gate coupled to the select signal; and
a large equalization FET having a source coupled to the true bit line, a drain coupled to the output of the pulse generator.

24. The electronic system of claim 16, the bit line driver further comprising:
a restore function having a phase mode input and a select signal input, the restore function further comprising:
a first plurality of FETs having drains coupled to the true phase bit line and sources coupled to a voltage supply; and
a second plurality of FETs having drains coupled to the complement phase bit line and sources coupled to the voltage supply;
wherein a value of the phase mode input determines a first particular FET in the first plurality of FETs and a second particular FET in the second plurality of FETs when the select signal goes inactive.

25. The electronic system of claim 24, the bit line driver further comprising an equalization function, the equalization function further comprising:
a first equalization FET having a source coupled to the true phase bit line and a drain coupled to the complement phase bit line; and
a second equalization FET having a source coupled to the true phase bit line and a drain coupled to the complement phase bit line;
wherein the first equalization FET is turned on when phase mode has a first phase mode value and the select signal is inactive, and wherein the second equalization FET is turned on when phase mode has a second phase mode value and the select signal is inactive.

26. The electronic system of claim 15, the controller further comprising:
a phase mode switch trigger capable of switching the phase mode from a first value to a second value.

27. The electronic system of claim 26, further comprising a timer coupled to the phase mode switch trigger, the phase mode switch trigger capable of using timing information from the timer to switch the phase mode from a first value to a second value at predetermined time intervals.

28. The electronic system of claim 26, the phase mode switch trigger in communication with an operating system, the operating system communicating to the phase mode switch trigger a restart of the electronic system.

29. The electronic system of claim 26, the phase mode switch trigger activating upon the restart of the electronic system communicated by the operating system.

30. The electronic system of claim 26, the phase mode switch trigger coupled to a nonvolatile storage upon which time of a restart is written, the phase mode switch trigger activating upon the restart of the electronic system communicated by the operating system if a predetermined time since a previous restart has elapsed.

31. A method for reducing bias temperature instability caused VT shifts in storage elements in an electronic system comprising the steps of:
storing storage element data as a true phase during a first state;
storing storage element data as a complement phase during a second state;
ensuring that the electronic system spends at least a first portion of a total operational time in the first state, accumulating a first total time in the first state; and
ensuring that the electronic system spends at least a second portion of a total operational time in the second state, accumulating a second total time in the second state.

32. The method of claim 31, further comprising the step of making the first total time substantially equal to the second total time.

33. The method of claim 31, further comprising the step of making the first total time no more than twice the second total time.

34. The method of claim 31, further comprising the step of making the first total time no more than four times the second total time.

35. The method of claim 31, further comprising the step of making the first time no more than ten times the second total time.

36. The method of claim 31, wherein the steps of ensuring that the electronic system spends at least the first portion of the total operational time in the first state and ensuring that the electronic system spends at least the second portion of total operational time in the second state further comprises the step of changing state from the first state to the second state or from the second state to the first state when a prespecified event occurs.

37. The method of claim 36, wherein the prespecified event is a restart of the electronic system.

38. The method of claim 36, wherein the prespecified event is a restart of the electronic system that occurs after more than a prespecified elapsed time since a previous restart of the electronic system.

39. The method of claim 36, wherein the prespecified event is the exceeding of a prespecified time since a previous change of states.

40. The method of claim 36, wherein the prespecified event is the beginning of a set of array built in self test patterns.

41. The method of claim 36, wherein the prespecified event is the completion of a set of array built in self test patterns.

42. The method of claim 36, wherein the prespecified event is the completion of a predetermined number of completions of a set of array built in self test patterns.

* * * * *